United States Patent
Yamazaki et al.

(10) Patent No.: US 10,230,418 B2
(45) Date of Patent: Mar. 12, 2019

(54) MULTIPLEXER, HIGH-FREQUENCY FRONT END CIRCUIT, AND COMMUNICATION DEVICE

(71) Applicant: Murata Manufacturing Co., Ltd., Nagaokakyo-shi, Kyoto-fu (JP)

(72) Inventors: Sunao Yamazaki, Nagaokakyo (JP); Yuichi Takamine, Nagaokakyo (JP); Toshimaro Yoneda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/963,569

(22) Filed: Apr. 26, 2018

(65) Prior Publication Data

US 2018/0337706 A1 Nov. 22, 2018

(30) Foreign Application Priority Data

May 19, 2017 (JP) .................................. 2017-099675
Mar. 23, 2018 (JP) .................................. 2018-056147

(51) Int. Cl.
| | |
|---|---|
| *H04B 1/44* | (2006.01) |
| *H04B 1/40* | (2015.01) |
| *H03F 3/19* | (2006.01) |
| *H01Q 1/50* | (2006.01) |
| *H03F 3/24* | (2006.01) |

(52) U.S. Cl.
CPC ................. *H04B 1/40* (2013.01); *H01Q 1/50* (2013.01); *H03F 3/19* (2013.01); *H03F 3/245* (2013.01); *H03F 2200/294* (2013.01); *H03F 2200/451* (2013.01)

(58) Field of Classification Search
CPC ... H04B 1/40; H04B 1/44; H04B 1/48; H04B 1/525; H01Q 1/50; H03F 3/19; H03F 3/245; H03H 9/0028; H03H 9/6483; H03H 9/706
See application file for complete search history.

(56) References Cited

U.S. PATENT DOCUMENTS

| | | | |
|---|---|---|---|
| 9,391,666 B1 | 7/2016 | Handtmann et al. | |
| 2006/0139125 A1* | 6/2006 | Shiga-ken | ............ H03H 9/0557 333/193 |
| 2010/0026419 A1 | 2/2010 | Hara et al. | |

(Continued)

FOREIGN PATENT DOCUMENTS

JP 2010-041141 A 2/2010

*Primary Examiner* — Thanh Le
(74) *Attorney, Agent, or Firm* — Keating & Bennett, LLP

(57) ABSTRACT

A multiplexer includes a common terminal, a reception terminal, and transmission terminals; a reception filter between the common terminal and the reception terminal; a transmission filter between the common terminal and the transmission terminal; a transmission filter between the common terminal and the transmission terminal; a first inductor connected in series between the common terminal and the reception filter; a second inductor connected between the transmission terminal and the transmission filter; and a third inductor connected between the transmission terminal and the transmission filter. The first inductor and the second inductor couple with each other through a magnetic field, and the first inductor and the third inductor couple with each other through a magnetic field.

20 Claims, 9 Drawing Sheets

(56) References Cited

U.S. PATENT DOCUMENTS

| | | | |
|---|---|---|---|
| 2012/0182087 A1* | 7/2012 | Ye | H03H 9/706 333/133 |
| 2014/0218127 A1* | 8/2014 | Nurikabe | H03H 9/706 333/133 |
| 2017/0111078 A1* | 4/2017 | Onodera | H04B 1/44 |
| 2018/0287582 A1* | 10/2018 | Matsumoto | H04B 1/525 |

* cited by examiner

— WORKING EXAMPLE: INDUCTORS 21 AND 12 BEING COUPLED
------ COMPARATIVE EXAMPLE: INDUCTORS 21 AND 12 NOT BEING COUPLED

MULTIPLEXER, HIGH-FREQUENCY FRONT END CIRCUIT, AND COMMUNICATION DEVICE

CROSS REFERENCE TO RELATED APPLICATIONS

This application claims the benefit of priority to Japanese Patent Application No. 2018-056147 filed on Mar. 23, 2018 and Japanese Patent Application No. 2017-099675 filed on May 19, 2017. The entire contents of each of these applications are hereby incorporated herein by reference.

BACKGROUND OF THE INVENTION

1. Field of the Invention

The present invention relates to a multiplexer, a high-frequency front end circuit, and a communication device.

2. Description of the Related Art

Cellular phones in recent years are required to be compliant with a plurality of frequency bands and a plurality of wireless methods, that is, to be multiband-compliant and multimode-compliant, by one terminal. In order to address this, a multiplexer that demultiplexes a high-frequency signal having a plurality of wireless carrier frequencies is arranged directly below one antenna.

U.S. Pat. No. 9,391,666 discloses a multiplexer having a configuration in which a plurality of filters having different pass bands are connected to a common terminal. Additionally, an inductor is connected between one filter among the plurality of filters and the common terminal.

As a parameter for evaluating performance of a multiplexer, isolation may be cited. As a configuration for ensuring the isolation, an existing configuration in which an inductance component is added in the inside of a filter may be cited.

However, as the number of frequency bands assigned to the multiplexer increases, that is, as the number of common connections of filters having different pass bands increases, the number of combinations of frequency bands for which the isolation is to be ensured increases. Accordingly, with only the inductance component (a ladder L, polarized L, or other suitable inductance component) included in the inside of the filter, it is difficult to improve isolation characteristics of the multiplexer. Particularly, between a transmission path in which a filter for transmission is arranged and a reception path in which a filter for reception is arranged, if a transmission signal with large electric power leaks to the reception path, reception sensitivity of the multiplexer is reduced.

SUMMARY OF THE INVENTION

Preferred embodiments of the present invention provide multiplexers, high-frequency front end circuits, and communication devices in which isolation between a transmission path and a reception path which are connected to a common terminal is improved.

A multiplexer according to a preferred embodiment of the present invention includes a common terminal, a first reception terminal, a first transmission terminal, and a second transmission terminal; a first reception filter provided between the common terminal and the first reception terminal; a first transmission filter provided between the common terminal and the first transmission terminal; a second transmission filter provided between the common terminal and the second transmission terminal; a first inductor connected in series between the common terminal and the first reception filter; a second inductor connected between the first transmission terminal and the first transmission filter; and a third inductor connected between the second transmission terminal and the second transmission filter, in which the first inductor and the second inductor couple with each other through a magnetic field, and the first inductor and the third inductor couple with each other through a magnetic field.

With the above-described configuration, by high frequency components leaking to the first reception filter among high-frequency transmission signals which have passed through the first transmission filter from the first transmission terminal and high frequency components from the first transmission terminal towards the first reception filter through the second inductor and the first inductor coupling with each other through a magnetic field being inverted in phase, these two high frequency components cancel each other out. Additionally, by high frequency components leaking to the first reception filter among high-frequency transmission signals which have passed through the second transmission filter from the second transmission terminal and high frequency components from the second transmission terminal toward the first reception filter through the third inductor and the first inductor coupling with each other through a magnetic field being inverted in phase, the two high frequency components cancel each other out. In other words, isolation between a transmission path in which the transmission filter is provided and a reception path in which the reception filter is provided is able to be improved. Accordingly, it is possible to reduce or prevent a transmission signal having relatively large electric power from leaking to the reception path and lowering reception sensitivity.

Additionally, the second inductor may be connected in series between the first transmission terminal and the first transmission filter, the third inductor may be connected in series between the second transmission terminal and the second transmission filter, and an inductance value of the first inductor may be larger than an inductance value of the second inductor and larger than an inductance value of the third inductor.

In a case in which an inductor is connected in series to a signal path, as the inductance value of the inductor increases, a propagation loss of the high-frequency signal increases. Particularly, in a transmission path required to transmit large electric power, it is important for performance improvement of the multiplexer to reduce the propagation loss of the high-frequency signal as much as possible.

With the above-described configuration, the second inductor and the third inductor each connected in series to the transmission path have the smaller inductance values than that of the first inductor connected in series to the reception path, and the propagation loss of the high-frequency transmission signal is therefore able to be reduced while ensuring the magnetic field coupling between the first inductor and the second inductor and the magnetic field coupling between the first inductor and the third inductor. Accordingly, high frequency propagation performance of the multiplexer is able to be improved.

Additionally, the first reception filter may have, of a first transmission band and a first reception band assigned to a first frequency band, the first reception band as a pass band, the first transmission filter may have the first transmission band as a pass band, and the second transmission filter may have, of a second transmission band and a second reception band assigned to a second frequency band different from the first frequency band, the second transmission band as a pass band.

With the above-described configuration, by the high frequency components leaking to the first reception filter among the high-frequency transmission signals which have passed through the first transmission filter and the high frequency components from the first transmission terminal towards the first reception filter through the second inductor and the first inductor coupling with each other through a magnetic field being inverted in phase, these two high frequency components cancel each other out. Accordingly, the isolation between the transmission signal and the reception signal of the first frequency band is able to be improved.

Additionally, by the high frequency components leaking to the first reception filter among the high-frequency transmission signals which have passed through the second transmission filter and the high frequency components from the second transmission terminal towards the first reception filter through the third inductor and the first inductor coupling with each other through a magnetic field being inverted in phase, these two high frequency components cancel each other out. Accordingly, cross-isolation between the reception signal of the first frequency band and the transmission signal of the second frequency band is able to be improved.

Additionally, the first reception filter, the first transmission filter, and the second transmission filter may be any one of a surface acoustic wave filter, an elastic wave filter using a BAW (Bulk Acoustic Wave), an LC resonance filter, and a dielectric filter.

As such, the first reception filter, the first transmission filter, and the second transmission filter are able to be reduced in size, and the multiplexer is therefore able to be reduced in size and in cost.

A multiplexer according to a preferred embodiment of the present invention includes a common terminal, a first transmission terminal, a first reception terminal, and a second reception terminal; a first transmission filter provided between the common terminal and the first transmission terminal; a first reception filter provided between the common terminal and the first reception terminal; a second reception filter provided between the common terminal and the second reception terminal; a first inductor connected in series between the common terminal and the first transmission filter; a second inductor connected between the first reception terminal and the first reception filter; and a third inductor connected between the second reception terminal and the second reception filter, in which the first inductor and the second inductor couple with each other through a magnetic field, and the first inductor and the third inductor couple with each other through a magnetic field.

With the above-described configuration, by high frequency components leaking to the first reception filter among high-frequency transmission signals which have passed through the first transmission filter from the first transmission terminal and high frequency components from the first transmission terminal towards the first reception terminal through the first inductor and the second inductor coupling with each other through a magnetic field being inverted in phase, the two high frequency components cancel each other out. Additionally, by high frequency components leaking to the second reception filter among the high-frequency transmission signals which have passed through the first transmission filter from the first transmission terminal and high frequency components from the first transmission terminal towards the second reception terminal through the first inductor and the third inductor coupling with each other through a magnetic field being inverted in phase, these two high frequency components cancel each other out. In other words, isolation between a transmission path in which the transmission filter is provided and a reception path in which the reception filter is provided is able to be improved. Accordingly, it is possible to reduce of prevent a transmission signal having relatively large electric power from leaking to the reception path and lowering reception sensitivity.

Additionally, the second inductor may be connected in series between the first reception terminal and the first reception filter, the third inductor may be connected in series between the second reception terminal and the second reception filter, and an inductance value of the first inductor may be smaller than an inductance value of the second inductor and smaller than an inductance value of the third inductor.

With this configuration, the first inductor connected in series to the transmission path has the smaller inductance value than those of the second inductor and the third inductor each connected in series to the reception path, and a propagation loss of the high-frequency transmission signal is therefore able to be reduced while ensuring the magnetic field coupling between the first inductor and the second inductor and the magnetic field coupling between the first inductor and the third inductor. Accordingly, high frequency propagation performance of the multiplexer is able to be improved.

Additionally, the first transmission filter may have, of a first transmission band and a first reception band assigned to a first frequency band, the first transmission band as a pass band, the first reception filter may have the first reception band as a pass band, and the second reception filter may have, of a second transmission band and a second reception band assigned to a second frequency band different from the first frequency band, the second reception band as a pass band.

With the above-described configuration, by the high frequency components leaking to the first reception filter among the high-frequency transmission signals which have passed through the first transmission filter and the high frequency components from the first transmission terminal toward the first reception terminal through the first inductor and the second inductor coupling with each other through a magnetic field being inverted in phase, the two high frequency components cancel each other out. Accordingly, the isolation between the transmission signal and the reception signal of the first frequency band is able to be improved.

Additionally, by the high frequency components leaking to the second reception filter among the high-frequency transmission signals which have passed through the first transmission filter and the high frequency components from the first transmission terminal toward the second reception terminal through the first inductor and the third inductor coupling with each other through a magnetic field being inverted in phase, these two high frequency components cancel each other out. Accordingly, cross-isolation between the reception signal of the second frequency band and the transmission signal of the first frequency band is able to be improved.

Additionally, the first transmission filter, the first reception filter, and the second reception filter may be any one of a surface acoustic wave filter, an elastic wave filter using a BAW, an LC resonance filter, and a dielectric filter.

As such, the first transmission filter, the first reception filter, and the second reception filter are able to be reduced in size, and the multiplexer is able to therefore be reduced in size and in cost.

Additionally, the multiplexer may further include an antenna terminal connected to an antenna element, and an impedance matching circuit connected between the antenna terminal and the common terminal.

With this configuration, even if the inductance values of the first inductor, the second inductor, and the third inductor are adjusted while giving priority to a degree of coupling of the magnetic field coupling, with the above-described impedance matching circuit, impedance matching between each transmission path and each reception path is able to be optimized. Accordingly, a degree of freedom in setting the inductance values of the first inductor, the second inductor, and the third inductor is improved.

Additionally, a high-frequency front end circuit according to a preferred embodiment of the present invention includes a multiplexer according to a preferred embodiment of the present invention, and an amplification circuit connected to the multiplexer.

With this configuration, the high-frequency front end circuit with improved isolation between the transmission path in which the transmission filter is provided and the reception path in which the reception filter is provided is able to be provided.

Additionally, a communication device according to a preferred embodiment of the present invention includes an RF signal processing circuit that processes a high-frequency signal transmitted and received through an antenna element, and the high-frequency front end circuit as described above, configured to transmit the high-frequency signal between the antenna element and the RF signal processing circuit.

With this configuration, a communication device with improved isolation between the transmission path in which the transmission filter is provided and the reception path in which the reception filter is provided is able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
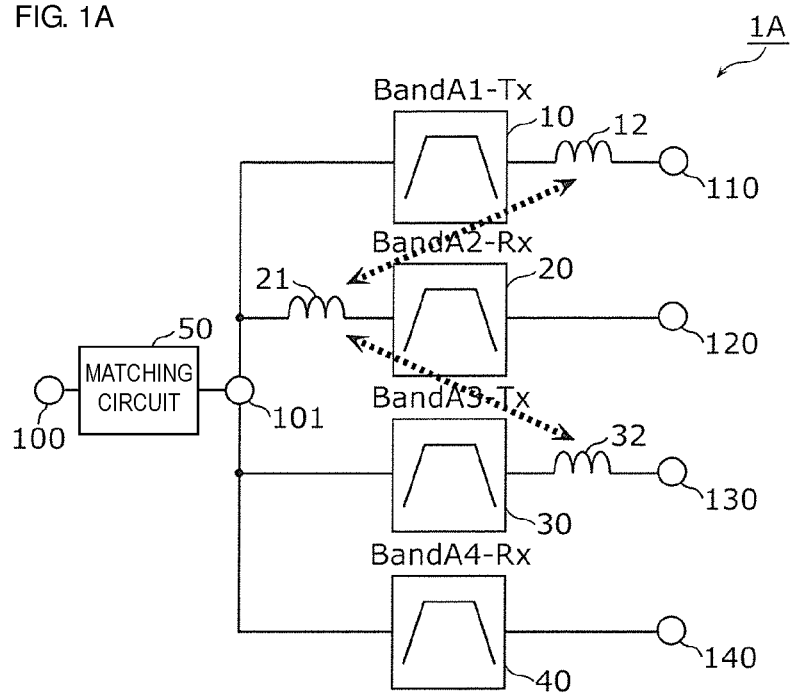
FIG. 1A is a circuit configuration diagram of a multiplexer according to a first preferred embodiment of the present invention.

Hereinafter, preferred embodiments of the present invention will be described in detail with reference to the drawings. Note that, all of the preferred embodiments described below indicate comprehensive or specific examples. Numerical values, shapes, materials, elements, arrangement and connection configurations of the elements, and other aspects, which will be described in the following preferred embodiments, are examples and are not intended to limit the present invention. Elements which are not described in independent claims among the elements in the following preferred embodiments are described as arbitrary elements. Additionally, sizes or size ratios of the elements illustrated in the drawings are not necessarily strict. Additionally, in the drawings, configurations that are substantially identical are denoted by identical reference numerals, redundant descriptions thereof will be omitted or simplified. Additionally, in the following preferred embodiments, "being connected" includes not only being directly connected, but also being electrically connected with other elements interposed therebetween.

In the preferred embodiments described below, "an inductor A and an inductor B being coupled with each other through a magnetic field" is defined as "an inductor A and an inductor B being coupled with each other through a magnetic field, with no shield member provided therebetween to block the magnetic field therebetween"

First Preferred Embodiment

FIG. 1A is a circuit configuration diagram of a multiplexer 1A according to a first preferred embodiment of the present invention. As illustrated in FIG. 1A, the multiplexer 1A includes transmission filters 10 and 30, reception filters 20 and 40, inductors 12, 21, and 32, an antenna terminal 100, a common terminal 101, transmission terminals 110 and 130, reception terminals 120 and 140, and a matching circuit 50.

The antenna terminal 100 is a connection terminal connected to an antenna element.

The common terminal 101 is connected to the transmission filters 10 and 30, the inductor 21, and the reception filter 40, and connected to the antenna terminal 100 with the matching circuit 50 interposed therebetween.

The transmission terminal 110 is a first transmission terminal connected to a power amplifier circuit that amplifies a high-frequency transmission signal. The transmission terminal 130 is a second transmission terminal connected to a power amplifier circuit that amplifies a high-frequency transmission signal.

The reception terminal 120 is a first reception terminal connected to a low noise amplifier circuit that amplifies a high-frequency reception signal.

The reception terminal 140 is a reception terminal connected to a low noise amplifier circuit that amplifies a high-frequency reception signal.

The transmission filter 10 is provided between the common terminal 101 and the transmission terminal 110, and is a first transmission filter to which a high-frequency transmission signal generated in a transmission circuit (RFIC or other suitable circuit) is input through the transmission terminal 110 and in which the high-frequency transmission signal is filtered with a transmission pass band of a Band A1 and output to the common terminal 101.

The reception filter 20 is provided between the common terminal 101 and the reception terminal 120, and is a first reception filter to which a high-frequency reception signal input from the common terminal 101 is input and in which the high-frequency reception signal is filtered with a reception pass band of a Band A2 and output to the reception terminal 120.

The transmission filter 30 is provided between the common terminal 101 and the transmission terminal 130, and is a second transmission filter to which a high-frequency transmission signal generated in a transmission circuit (RFIC or other suitable circuit) is input through the transmission terminal 130 and in which the high-frequency transmission signal is filtered with a transmission pass band of a Band A3 and output to the common terminal 101.

The reception filter 40 is provided between the common terminal 101 and the reception terminal 140, and is a filter to which a high-frequency reception signal input from the common terminal 101 is input and in which the high-frequency reception signal is filtered with a reception pass band of a Band A4 and output to the reception terminal 140.

The inductor 12 is a second inductor connected between the transmission terminal 110 and the transmission filter 10.

The inductor 32 is a third inductor connected between the transmission terminal 130 and the transmission filter 30.

The inductor 21 is a first inductor connected in series between the common terminal 101 and the reception filter 20.

The matching circuit 50 is connected between the antenna terminal 100 and the common terminal 101, and is an impedance matching circuit that matches impedance between an antenna element and the multiplexer 1A. The matching circuit 50 may include, for example, one inductor connected in series to the antenna terminal 100 and the common terminal 101, or may include one inductor connected between a connection node between the antenna terminal 100 and the common terminal 101 and a ground. Furthermore, in addition to these inductors, the matching circuit 50 may include capacitors connected in series or in parallel. In other words, it is sufficient that the matching circuit 50 includes one or more inductors and one or more capacitors that are connected in series or in parallel.

In the multiplexer 1A, the inductor 21 and the inductor 12 couple with each other through a magnetic field, and the inductor 21 and the inductor 32 couple with each other through a magnetic field.

With this configuration, high frequency components leaking to the reception filter 20 among high-frequency transmission signals which have passed through the transmission filter 10 from the transmission terminal 110 and high frequency components from the transmission terminal 110 toward the reception filter 20 through the inductors 12 and 21 coupling with each other through a magnetic field cancel each other out.

It is preferable that a degree of electromagnetic field coupling between the inductors 12 and 21 be optimized such that the two high frequency components have a phase inverted relationship, and the high frequency components leaking to the reception filter 20 among the high-frequency transmission signals which have passed through the transmission filter 10 from the transmission terminal 110 be reduced or minimized.

Additionally, high frequency components leaking to the reception filter 20 among high-frequency transmission signals which have passed through the transmission filter 30 from the transmission terminal 130 and high frequency components from the transmission terminal 130 towards the reception filter 20 through the inductors 32 and 21 coupling with each other through a magnetic field cancel each other out.

It is preferable that a degree of electromagnetic field coupling between the inductors 32 and 21 be optimized such that the above-described two high frequency components have a phase inverted relationship, and the high frequency components leaking to the reception filter 20 among the high-frequency transmission signals which have passed through the transmission filter 30 from the transmission terminal 130 be reduced or minimized.

In other words, isolation between a transmission path in which the transmission filters 10 and 30 are each provided and a reception path in which the reception filter 20 is provided is able to be improved. Accordingly, it is possible to reduce or prevent the high-frequency transmission signal having relatively large electric power from leaking to the reception path and lowering reception sensitivity of the multiplexer 1A.

Additionally, by providing the matching circuit 50, even if inductance values of the inductors 12, 21, and 32 are adjusted while prioritizing a degree of coupling of the magnetic field coupling, impedance matching between the antenna element and each transmission path and each reception path is able to be optimized. Accordingly, a degree of freedom in setting the inductance values of the inductors 12, 21, and 32 is improved.

The matching circuit 50 is not a required element, may not be provided.

Additionally, in the multiplexer 1A according to the present preferred embodiment, the Band A1 and the Band A2 may be the same frequency band, or may be different frequency bands from each other. In a case in which the Band A1 and the Band A2 are the same frequency band, the transmission filter 10 and the reception filter 20 define, for example, a duplexer in which a transmission pass band and a reception pass band are assigned to the frequency band. Additionally, in a case in which the Band A1 and the Band A2 are different frequency bands from each other, the transmission filter 10 and the reception filter 20 respectively define single filters having different pass bands from each other. In the same manner, the Band A3 and the Band A4 may be the same frequency band, or may be different frequency bands from each other. In a case in which the Band A3 and the Band A4 are the same frequency band, the transmission filter 30 and the reception filter 40 define, for example, a duplexer in which a transmission pass band and a reception pass band are assigned to the frequency band. Additionally, in a case in which the Band A3 and the Band A4 are different frequency bands from each other, the transmission filter 30 and the reception filter 40 respectively define single filters having different pass bands from each other.

Additionally, the transmission filters 10 and 30 and the reception filters 20 and 40 may be any one of a surface acoustic wave filter, an elastic wave filter using a BAW (Bulk Acoustic Wave), an LC resonance filter, and a dielectric filter. As such, each of the filters is able to be reduced in size, and the multiplexer 1A is therefore able to be reduced in size and in cost.

The transmission filters 10 and 30 and the reception filter 20 are each preferably an elastic wave filter. Particularly, the transmission filters 10 and 30 and the reception filter 20 may each be a ladder type elastic wave filter including one or more serial arm resonators and one or more parallel arm resonators. In this case, the inductors 21, 12 and 32 may be defined and function to adjust an attenuation pole of a filter bandpass characteristic and provide impedance matching.

Figure 1B:
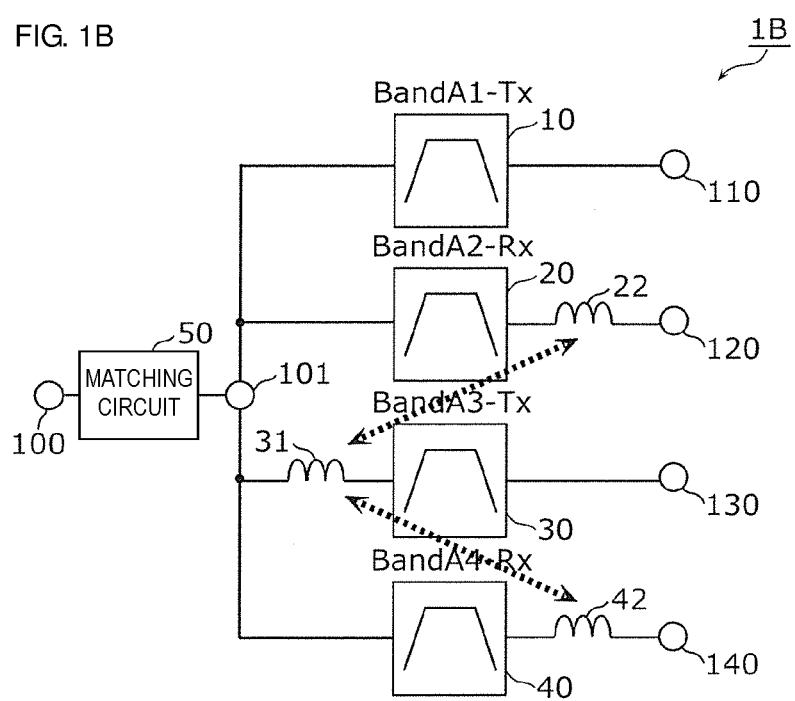
FIG. 1B is a circuit configuration diagram of a multiplexer according to a variation on the first preferred embodiment of the present invention.

FIG. 1B is a circuit configuration diagram of a multiplexer 1B according to a variation on the first preferred embodiment. The multiplexer 1B according to the present variation is different from the multiplexer 1A according to the first preferred embodiment in which the inductors are provided in two transmission paths and one reception path in that the inductors are provided in one transmission path and two reception paths. Hereinafter, descriptions of the common points in the multiplexer 1B according to the present variation and the multiplexer 1A according to the first preferred embodiment will be omitted, and the different points will be primarily described.

As illustrated in FIG. 1B, the multiplexer 1B includes the transmission filters 10 and 30, the reception filters 20 and 40, inductors 22, 31 and 42, the antenna terminal 100, the common terminal 101, the transmission terminals 110 and 130, the reception terminals 120 and 140, and the matching circuit 50.

The common terminal 101 is connected to the transmission filter 10, the reception filters 20 and 40, and the inductor 31, and connected to the antenna terminal 100 with the matching circuit 50 interposed therebetween.

The transmission terminal 110 is a transmission terminal connected to a power amplifier circuit that amplifies a high-frequency transmission signal. The transmission terminal 130 is a first transmission terminal connected to a power amplifier circuit that amplifies a high-frequency transmission signal.

The reception terminal 120 is a second reception terminal connected to a low noise amplifier circuit that amplifies a high-frequency reception signal.

The reception terminal 140 is a first reception terminal connected to a low noise amplifier circuit that amplifies a high-frequency reception signal.

The inductor 22 is a third inductor connected between the reception terminal 120 and the reception filter 20.

The inductor 42 is a second inductor connected between the reception terminal 140 and the reception filter 40.

The inductor 31 is a first inductor connected in series between the common terminal 101 and the transmission filter 30.

In the multiplexer 1B, the inductor 31 and the inductor 22 couple with each other through a magnetic field and the inductor 31 and the inductor 42 couple with each other through a magnetic field.

With this configuration, high frequency components leaking to the reception filter 40 among high-frequency transmission signals which have passed through the transmission filter 30 from the transmission terminal 130 and high frequency components from the transmission terminal 130 towards the reception terminal 140 through the inductors 31 and 42 coupling with each other through a magnetic field cancel each other out.

It is preferable that a degree of electromagnetic field coupling between the inductors 31 and 42 be optimized such that the two high frequency components have a phase inverted relationship, and the high frequency components leaking to the reception filter 40 among the high-frequency transmission signals which have passed through the transmission filter 30 from the transmission terminal 130 be minimized.

Additionally, high frequency components leaking to the reception filter 20 among the high-frequency transmission signals which have passed through the transmission filter 30 from the transmission terminal 130 and high frequency components from the transmission terminal 130 towards the reception terminal 120 through the inductors 31 and 22 coupling with each other through a magnetic field cancel each other out.

It is preferable that a degree of electromagnetic field coupling between the inductors 31 and 22 be optimized such that the two high frequency components have a phase inverted relationship, and the high frequency components leaking to the reception filter 20 among the high-frequency transmission signals which have passed through the transmission filter 30 from the transmission terminal 130 be minimized.

In other words, isolation between the transmission path in which the transmission filter 30 is provided and each of the reception paths in which the reception filters 20 and 40 are respectively improved. Accordingly, it is possible to reduce or prevent the transmission signal having relatively large electric power from leaking to the reception path and lowering reception sensitivity.

Additionally, in the multiplexer 1B according to the present variation, the Band A1 and the Band A2 may be the same frequency band, or may be different frequency bands from each other. In a case in which the Band A1 and the Band A2 are the same frequency band, the transmission filter 10 and the reception filter 20 define, for example, a duplexer in which a transmission pass band and a reception pass band are assigned to the frequency band. Additionally, in a case in which the Band A1 and the Band A2 are different frequency bands from each other, the transmission filter 10 and the reception filter 20 respectively define single filters having different pass bands from each other. In the same manner, the Band A3 and the Band A4 may be the same frequency band, or may be different frequency bands from each other. In a case in which the Band A3 and the Band A4 are the same frequency band, the transmission filter 30 and the reception filter 40 define, for example, a duplexer in which a transmission pass band and a reception pass band are assigned to the frequency band. Additionally, in a case in which the Band A3 and the Band A4 are different frequency bands from each other, the transmission filter 30 and the reception filter 40 respectively define single-filters having different pass bands from each other.

Figure 2:
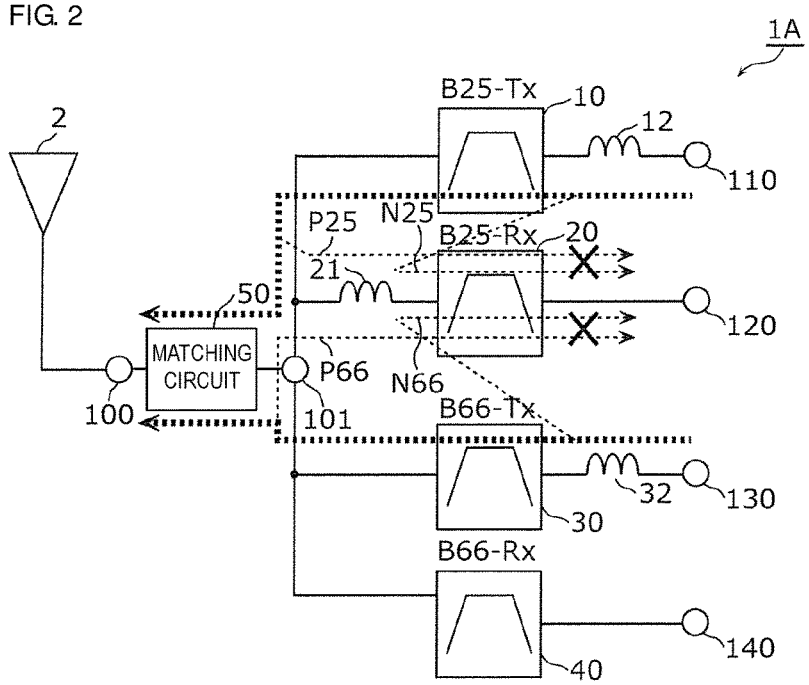
FIG. 2 is a circuit configuration diagram of the multiplexer according to a working example.

FIG. 2 is a circuit configuration diagram of the multiplexer 1A according to a working example of a preferred embodiment of the present invention. The multiplexer 1A according to the present working example is an example in which the multiplexer 1A according to the first preferred embodiment is applied to a quadplexer with Bands 25 and 66 of LTE (Long Term Evolution).

The transmission filter 10 is a band pass filter whose pass band is a transmission pass band (for example about 1850

MHZ to about 1915 MHz: first transmission band) of the Band 25 (first frequency band).

The reception filter 20 is a band pass filter whose pass band is a reception pass band (for example, about 1930 MHz to about 1995 MHz: first reception band) of the Band 25 (first frequency band).

The transmission filter 30 is a band pass filter whose pass band is a transmission pass band (for example, about 1710 MHz to about 1780 MHz: second transmission band) of the Band 66 (second frequency band).

The reception filter 40 is a band pass filter whose pass band is a reception pass band (for example, about 2110 MHz to about 2200 MHz: second reception band) of the Band 66 (second frequency band).

The inductor 12 is connected in series between the transmission terminal 110 and the transmission filter 10.

The inductor 32 is connected in series between the transmission terminal 130 and the transmission filter 30.

The inductor 21 is connected in series between the common terminal 101 and the reception filter 20.

In the present working example, there is a possibility that a high-frequency transmission signal of the Band 25 leaks to the reception path of the Band 25 in which the reception filter 20 is provided and a high-frequency transmission signal of the Band 66 leaks to the reception path of the Band 25 through the common terminal 101.

In contrast, in the multiplexer 1A according to the present working example, the inductor 21 and the inductor 12 couple with each other through a magnetic field and the inductor 21 and the inductor 32 couple with each other through a magnetic field.

With this configuration, by high frequency components P25 leaking to the reception filter 20 among the high-frequency transmission signals which have passed through the transmission filter 10 and high frequency components N25 from the transmission terminal 110 towards the reception filter 20 through the inductors 12 and 21 coupling with each other through a magnetic field being inverted in phase, these two high frequency components cancel each other out. Accordingly, isolation between the transmission signal and the reception signal of the Band 25 is able to be improved.

Additionally, by high frequency components P66 leaking to the reception filter 20 among the high-frequency transmission signals which have passed through the transmission filter 30 and high frequency components N66 from the transmission terminal 130 towards the reception filter 20 through the inductors 32 and 21 coupling with each other through a magnetic field being inverted in phase, these two high frequency components cancel each other out. Accordingly, cross-isolation between a reception signal and a transmission signal of different frequency bands is able to be improved.

Additionally, in the multiplexer 1A according to the present working example, preferably, an inductance value of the inductor 21 is set to about 5.2 nH, an inductance value of the inductor 12 is set to about 1.5 nH, an inductance value of the inductor 32 is set to about 3.9 nH, for example. In other words, the inductance value of the inductor 21 is preferably larger than the inductance value of the inductor 12 and larger than the inductance value of the inductor 32.

In a case in which the inductor is connected in series to a signal path, as the inductance value of the inductor increases, a propagation loss of the high-frequency signal increases. Particularly, in the transmission path required to transmit large electric power, it is important for performance improvement of the multiplexer 1A to reduce the propagation loss of the high-frequency signal as much as possible.

According to the above-described relationship among the inductors 12, 21, and 32, the inductors 12 and 32 connected in series, respectively, to the transmission path in which the transmission filter 10 is provided and to the transmission path in which the transmission filter 30 is provided each have a smaller inductance value than that of the inductor 21 connected in series to the reception path in which the reception filter 20 is arranged. Accordingly, the propagation loss of the high-frequency transmission signal is able to be reduced while ensuring the magnetic field coupling between the inductor 21 and the inductor 12 and the magnetic field coupling between the inductor 21 and the inductor 32. Accordingly, high frequency propagation performance of the multiplexer 1A is able to be improved.

From the standpoint of reducing the signal propagation loss in the transmission path as much as possible, in the multiplexer 1B, the inductance value of the inductor 31 is preferably smaller than the inductance value of the inductor 22 and smaller than the inductance value of the inductor 42. With this, the propagation loss of the high-frequency transmission signal is able to be reduced while ensuring the magnetic field coupling between the inductor 31 and the inductor 22 and the magnetic field coupling between the inductor 31 and the inductor 42. Accordingly, high frequency propagation performance of the multiplexer 1B is able to be improved.

Note that, the inductors 12, 21, and 32 may each preferably be, for example, an inductance element having a substantially chip shape provided on a mounting substrate in or on which the transmission filters 10 and 30 and the reception filters 20 and 40 are mounted. In this case, a degree of magnetic field coupling between the inductor 12 and the inductor 21 and a degree of magnetic field coupling between the inductor 21 and the inductor 32 are adjusted depending on a distance between the inductor 12 and the inductor 21 having chip shapes or substantially chip shapes and an arrangement direction thereof, and a distance between the inductor 32 and the inductor 21 having chip shapes or substantially chip shapes and an arrangement direction thereof, respectively.

Additionally, at least one of the inductors 12, 21, and 32 may preferably be an inductance element incorporated in a mounting substrate. In this case, the inductance element incorporated in the mounting substrate is, for example, defined by coil patterns laminated in the mounting substrate. In this case, a degree of magnetic field coupling between the inductor 12 and the inductor 21 and a degree of magnetic field coupling between the inductor 21 and the inductor 32 are adjusted depending on a distance and an arrangement relationship between the inductor 12 and the inductor 21 incorporated in the substrate and a distance and an arrangement relationship between the inductor 32 and the inductor 21 having chip shapes or substantially chip shapes, respectively. Note that, as the arrangement relationship between two inductors incorporated in the substrate, overlapping, separating, or other suitable arrangements of winding axes of the coil patterns may be utilized.

Note that, the multiplexer 1B may also be applied to a quadplexer with the Bands 25 and 66 of LTE. Hereinafter, an example in which the multiplexer 1B is applied to a quadplexer with the Bands 25 and 66 of LTE will be described.

The transmission filter 10 is a band pass filter whose pass band is a transmission pass band (for example, about 1850 MHz to about 1915 MHz: second transmission band) of the Band 25 (second frequency band).

The reception filter 20 is a band pass filter whose pass band is a reception pass band (for example, about 1930 MHz to about 1995 MHz: second reception band) of the Band 25 (second frequency band).

The transmission filter 30 is a band pass filter whose pass band is a transmission pass band (for example, about 1710 MHz to about 1780 MHz: first transmission band) of the Band 66 (first frequency band).

The reception filter 40 is a band pass filter whose pass band is a reception pass band (for example, about 2110 MHz to about 2200 MHz: first reception band) of the Band 66 (first frequency band).

The inductor 22 is connected in series between the reception terminal 120 and the reception filter 20.

The inductor 42 is connected in series between the reception terminal 140 and the reception filter 40.

The inductor 31 is connected in series between the common terminal 101 and the transmission filter 30.

In the present working example, there is a possibility that a high-frequency transmission signal of the Band 66 leaks to the reception path of the Band 66 in which the reception filter 40 is provided and leaks to the reception path of the Band 25 through the common terminal 101.

In contrast, in the multiplexer 1B, the inductor 31 and the inductor 42 couple with each other through a magnetic field and the inductor 31 and the inductor 22 couple with each other through a magnetic field.

With this configuration, by high frequency components leaking to the reception filter 40 among high-frequency transmission signals which have passed through the transmission filter 30 and high frequency components from the transmission terminal 130 towards the reception terminal 140 through the inductors 31 and 42 coupling with each other through a magnetic field being inverted in phase, these two high frequency components cancel each other out. Accordingly, isolation between the transmission signal and the reception signal of the Band 66 is able to be improved.

Additionally, by high frequency components leaking to the reception filter 20 among the high-frequency transmission signals which have passed through the transmission filter 30 and high frequency components from the transmission terminal 130 towards the reception terminal 120 through the inductors 31 and 22 coupling with each other through a magnetic field being inverted in phase, these two high frequency components cancel each other out. Accordingly, cross-isolation between the reception signal and the transmission signal of different frequency bands is able to be improved.

Next, high frequency propagation characteristics of the multiplexer 1A according to the working example and a multiplexer according to a comparative example are compared.

Note that, the multiplexer according to the comparative example has the same or substantially the same circuit elements as the circuit elements of the multiplexer 1A according to the working example, but is different from the multiplexer 1A according to the working example in that the inductor 21 and the inductor 12 do not couple with each other through a magnetic field and the inductor 21 and the inductor 32 do not couple with each other through a magnetic field.

Figure 3A:
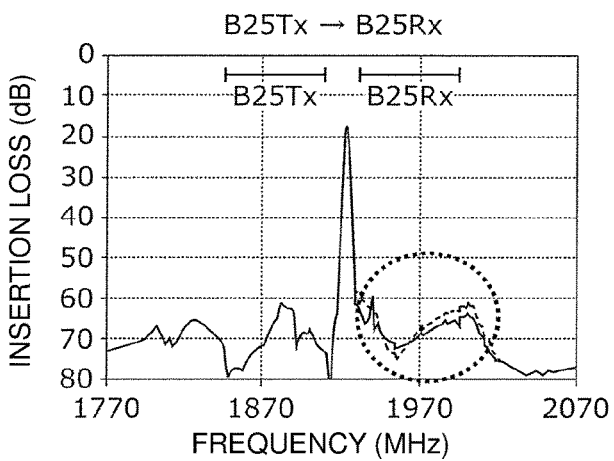
FIG. 3A is a graph illustrating a comparison of isolation characteristics of the multiplexers according to the working example and a comparative example at a Band 25.

FIG. 3A is a graph illustrating a comparison of the isolation characteristics of the multiplexers according to the working example and the comparative example at the Band 25.

In the multiplexer according to the comparative example, the high-frequency transmission signal of the Band 25 leaks to the reception path of the Band 25 in which the reception filter 20 is provided.

In contrast, in the multiplexer 1A according to the working example, since the inductor 21 and the inductor 12 couple with each other through a magnetic field, the high frequency components P25 leaking to the reception filter 20 among the high-frequency transmission signals which have passed through the transmission filter 10 of the Band 25 and the high frequency components N25 from the transmission terminal 110 towards the reception filter 20 through the inductors 12 and 21 coupling with each other through a magnetic field are inverted in phase. With this configuration, the two high frequency components P25 and N25 cancel each other out, and the isolation is particularly improved in the reception band of the Band 25 (a region surrounded by a broken line in FIG. 3A).

Figure 3B:
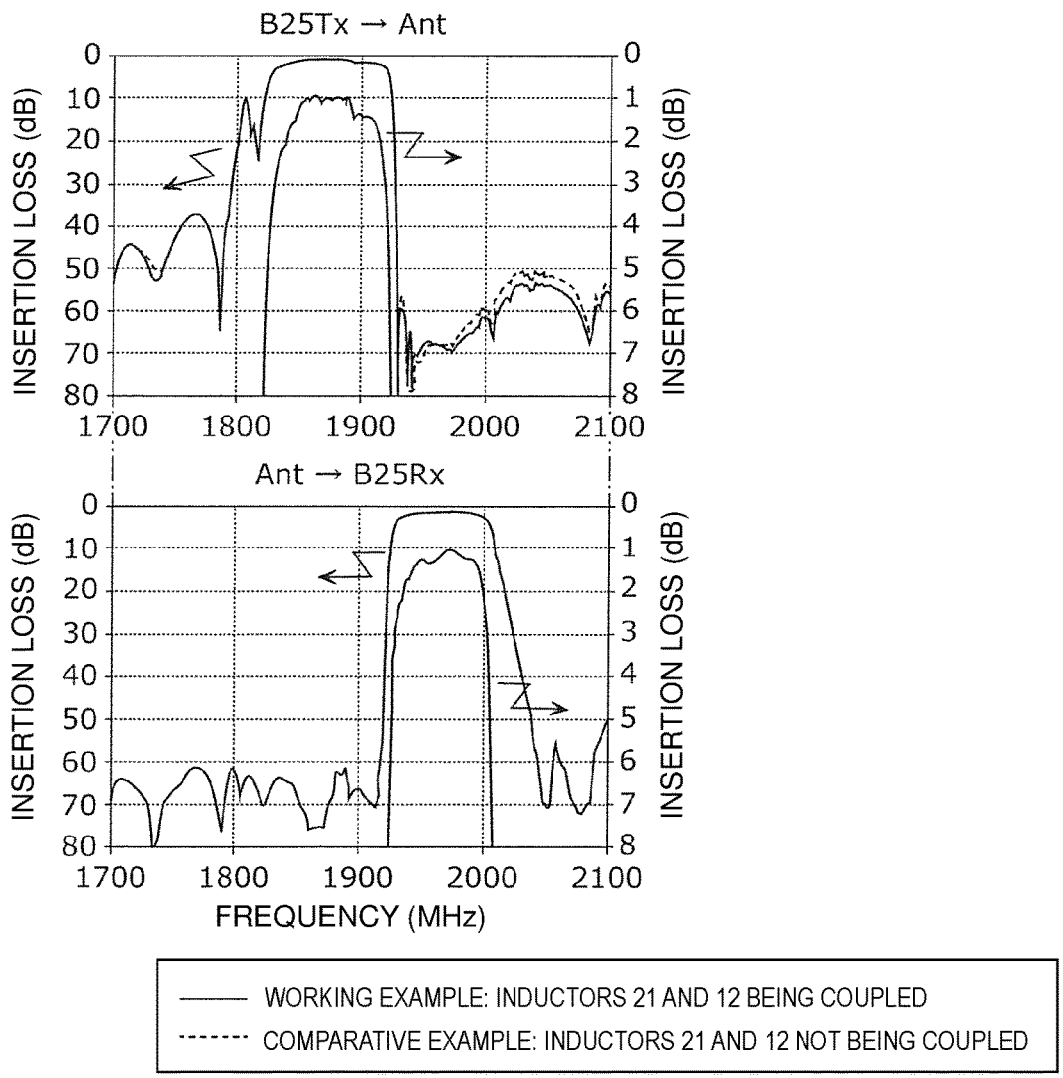
FIG. 3B is a graph illustrating a comparison of bandpass characteristics of Band 25 filters according to the working example and the comparative example.

FIG. 3B is a graph illustrating a comparison of bandpass characteristics of the Band 25 filters according to the working example and the comparative example. An upper portion of the diagram illustrates a comparison of the bandpass characteristics of the transmission filters of the Band 25, a lower portion of this diagram illustrates a comparison of the bandpass characteristics of the reception filters of the Band 25. As illustrated in the upper portion of this diagram, it can be seen that, in response to improvement of the isolation in the reception band of the Band 25, attenuation in the reception band of the transmission filter 10 of the Band 25 is also improved. On the other hand, in the reception filter 20 of the Band 25, it can be seen that the bandpass characteristic does not significantly change depending on the presence or absence of the magnetic field coupling between the inductors 21 and 12.

Figure 4:
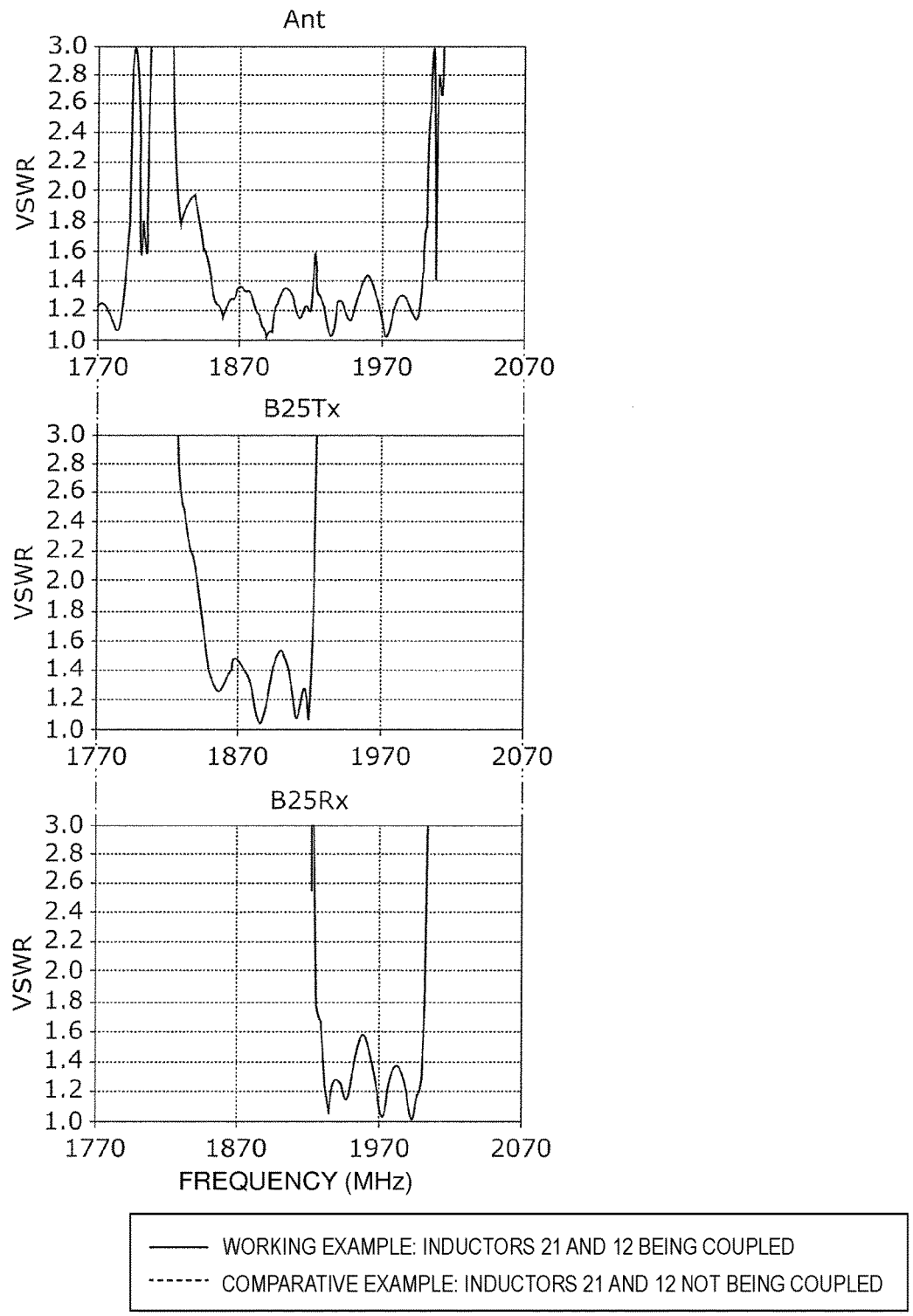
FIG. 4 is a graph illustrating a VSWR (Voltage Standing Wave Ratio) of the Band 25 filters according to the working example and the comparative example.

FIG. 4 is a graph illustrating a VSWR (Voltage Standing Wave Ratio) of the Band 25 filters according to the working example and the comparative example. An upper portion of this diagram illustrates the VSWR when the multiplexer is viewed from the antenna terminal 100 side, a middle portion of this diagram illustrates the VSWR when the multiplexer is viewed from the transmission terminal 110 side, and a lower portion of this diagram illustrates the VSWR when the multiplexer is viewed from the reception terminal 120 side.

As illustrated in FIG. 4, it can be seen that the input/output impedance in the transmission filter and the reception filter of the Band 25 does not significantly change depending on the presence or absence of the magnetic field coupling between the inductors 21 and 12.

Figure 5A:
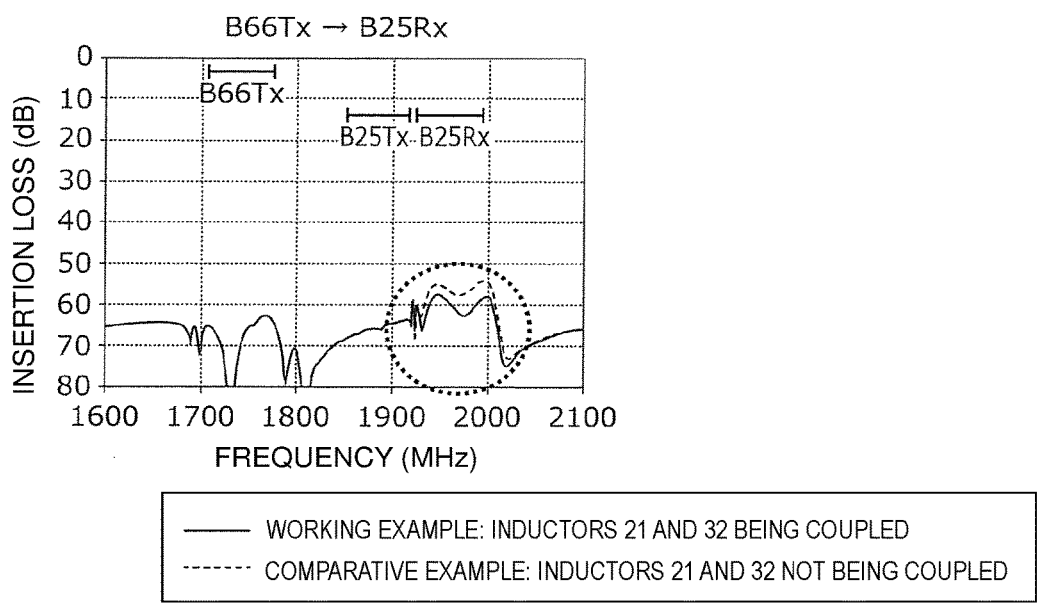
FIG. 5A is a graph illustrating a comparison of isolation characteristics of Band 66 transmission filters–Band 25 reception filters of the multiplexers according to the working example and the comparative example.

FIG. 5A is a graph illustrating a comparison of isolation characteristics of the Band 66 transmission filters–the Band 25 reception filters of the multiplexers according to the working example and the comparative example.

In the multiplexer according to the comparative example, the high-frequency transmission signal of the Band 66 leaks to the reception path of the Band 25 in which the reception filter 20 is provided.

In contrast, in the multiplexer 1A according to the working example, since the inductor 21 and the inductor 32 couple with each other through a magnetic field, the high frequency components P66 leaking to the reception filter 20 among the high-frequency transmission signals which have passed through the transmission filter 30 of the Band 66 and the high frequency components N66 from the transmission terminal 130 towards the reception filter 20 through the inductors 32 and 21 coupling with each other through a magnetic field are inverted in phase. With this configuration, the two high frequency components P66 and N66 cancel each other out, and the cross-isolation is particularly improved in the reception band of the Band 25 (a region surrounded by a broken line in FIG. 5A).

Figure 5B:
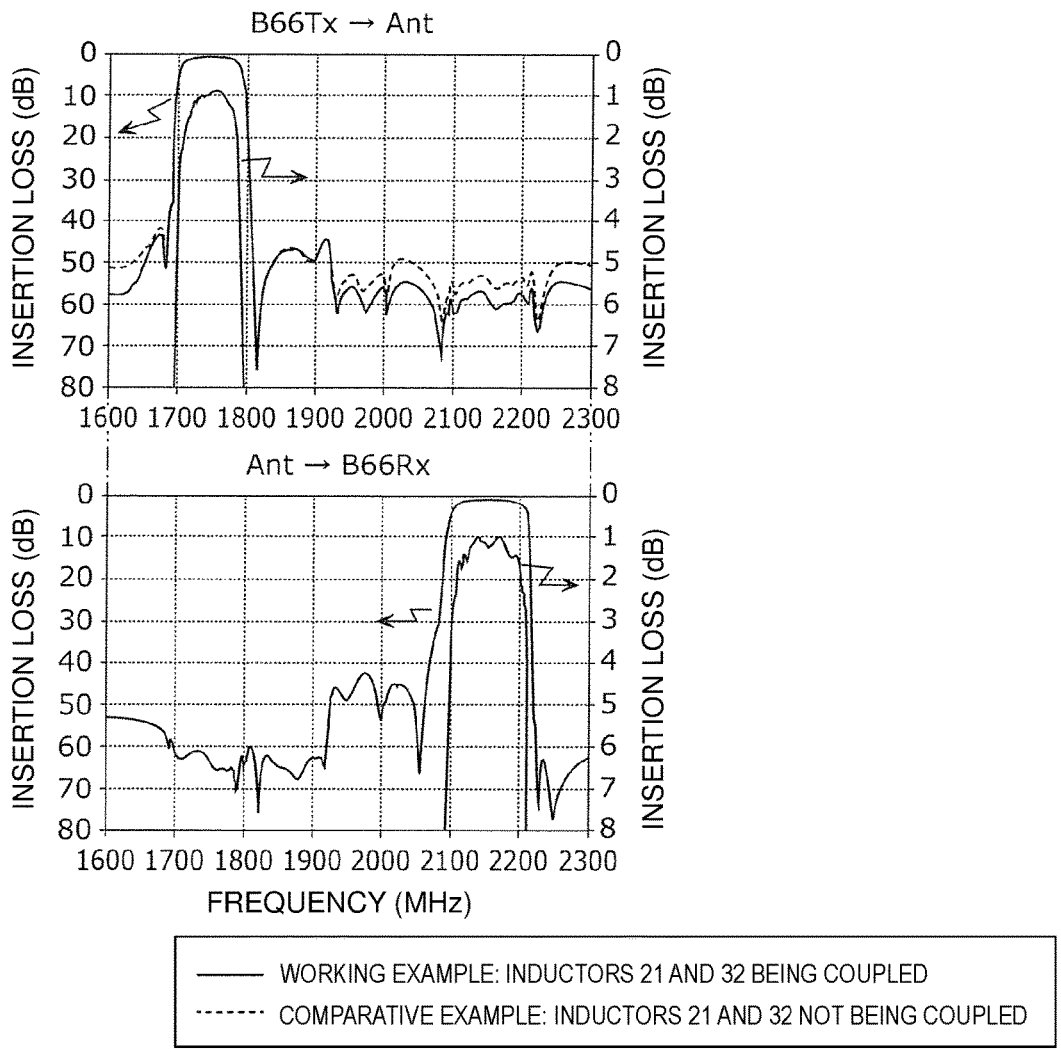
FIG. 5B is a graph illustrating a comparison of bandpass characteristics of the Band 66 filters according to the working example and the comparative example.

FIG. 5B is a graph illustrating a comparison of bandpass characteristics of the Band 66 filters according to the working example and the comparative example. An upper portion of this diagram illustrates a comparison of the bandpass characteristics of the transmission filters of the Band 66, a lower portion of this diagram illustrates a comparison of the bandpass characteristics of the reception filters of the Band 66. As illustrated in the upper portion of this diagram, it can be seen that, in response to improvement of the cross-isolation in the reception band of the Band 25, attenuation in the vicinity of the Band 25 reception band of the transmission filter 30 of the Band 66 is also improved. On the other hand, in the reception filter 40 of the Band 66, it can be seen that the bandpass characteristic does not significantly change depending on the presence or absence of the magnetic field coupling between the inductors 32 and 21.

Figure 6:
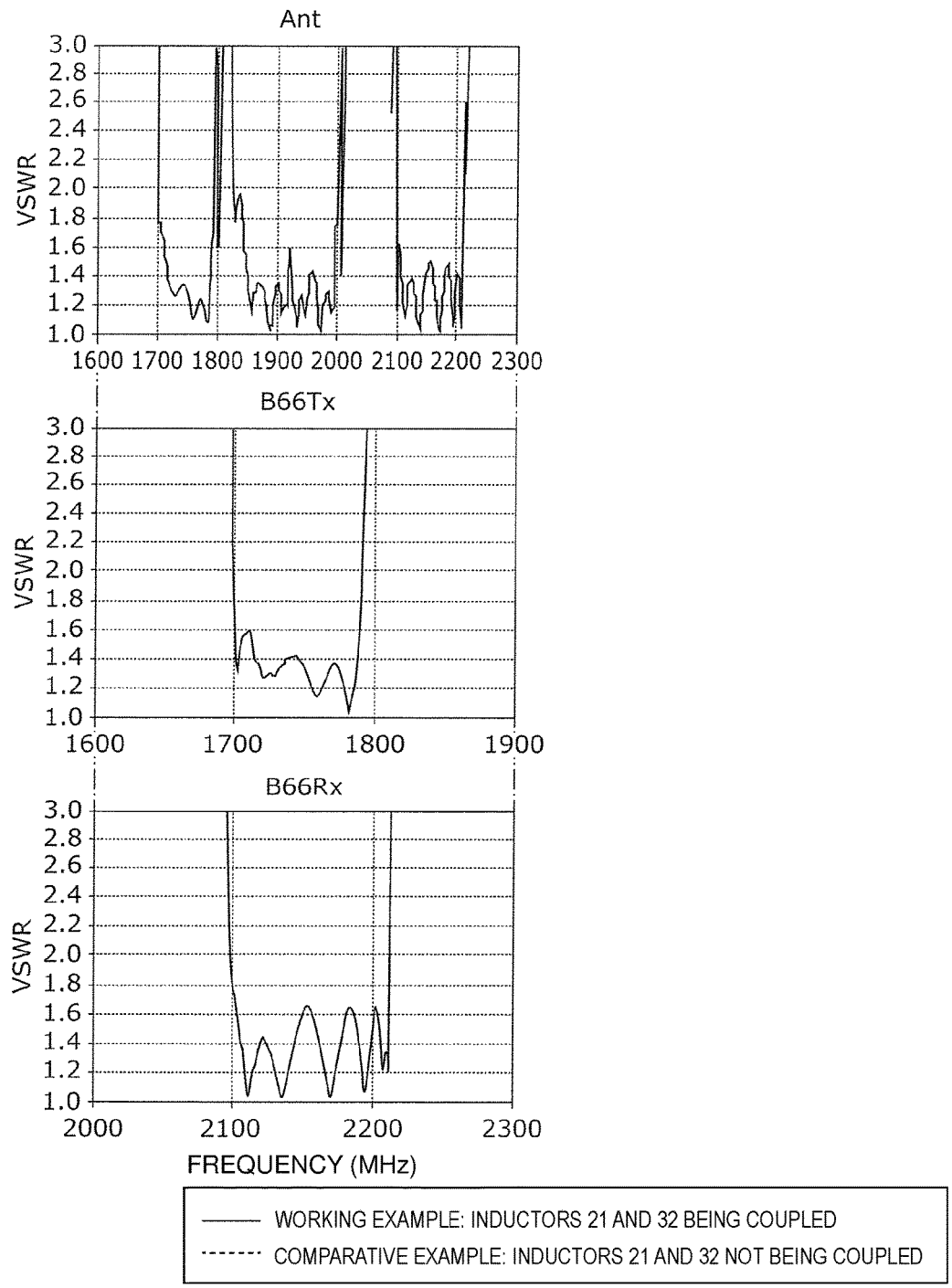
FIG. 6 is a graph illustrating a VSWR (Voltage Standing Wave Ratio) of the Band 66 filters according to the working example and the comparative example.

FIG. 6 is a graph illustrating a VSWR (Voltage Standing Wave Ratio) of the Band 66 filters according to the working example and the comparative example. An upper portion of this diagram illustrates the VSWR when the multiplexer is viewed from the antenna terminal 100 side, a middle portion of this diagram illustrates the VSWR when the multiplexer is viewed from the transmission terminal 130 side, and a lower portion of this diagram illustrates the VSWR when the multiplexer is viewed from the reception terminal 140 side.

As illustrated in FIG. 6, it can be seen that input/output impedance in the transmission filter and the reception filter of the Band 66 does not significantly change depending on the presence or absence of the magnetic field coupling between the inductors 32 and 21.

Figure 7A:
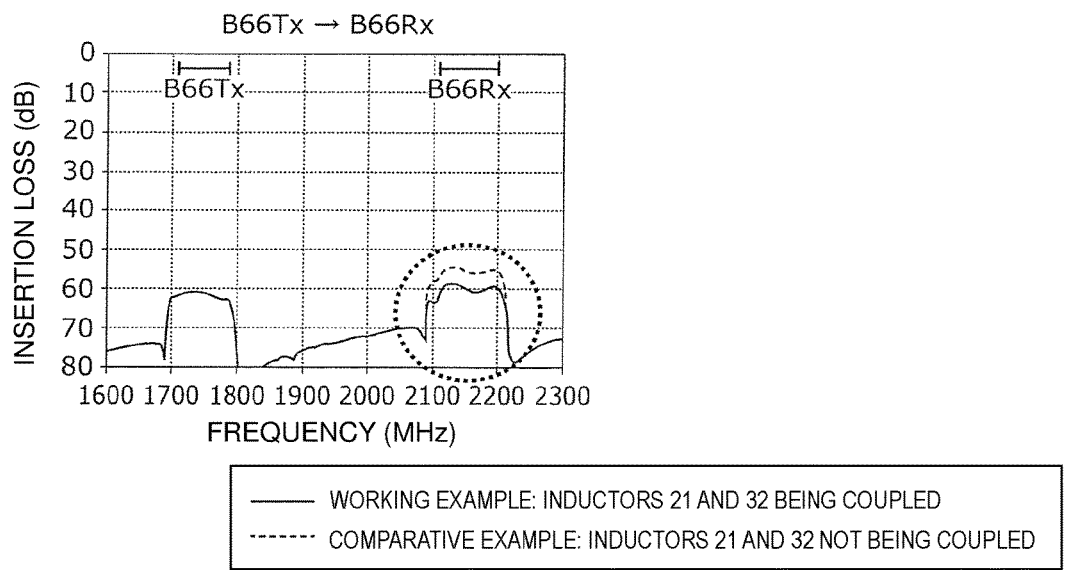
FIG. 7A is a graph illustrating a comparison of isolation characteristics of the multiplexers according to the working example and the comparative example at the Band 66.

FIG. 7A is a graph illustrating a comparison of isolation characteristics of the multiplexers according to the working example and the comparative example at the Band 66. In the multiplexers according to the working example and the comparative example, since the inductor is not provided in the reception path in which the reception filter 40 is provided, it is estimated that there is no isolation improvement effect by the magnetic field coupling with the inductor 32. Note that, since the high frequency components P66 leaking to the reception filter 20 among the high-frequency transmission signals of the Band 66 are canceled out by the magnetic field coupling between the inductors 32 and 21, it is estimated that the high frequency components leaking to the reception filter 40 among the high-frequency transmission signals of the Band 66 are also relatively reduced. With this, it can be seen that the isolation is improved in the reception band of the Band 66 as well.

Figure 7B:
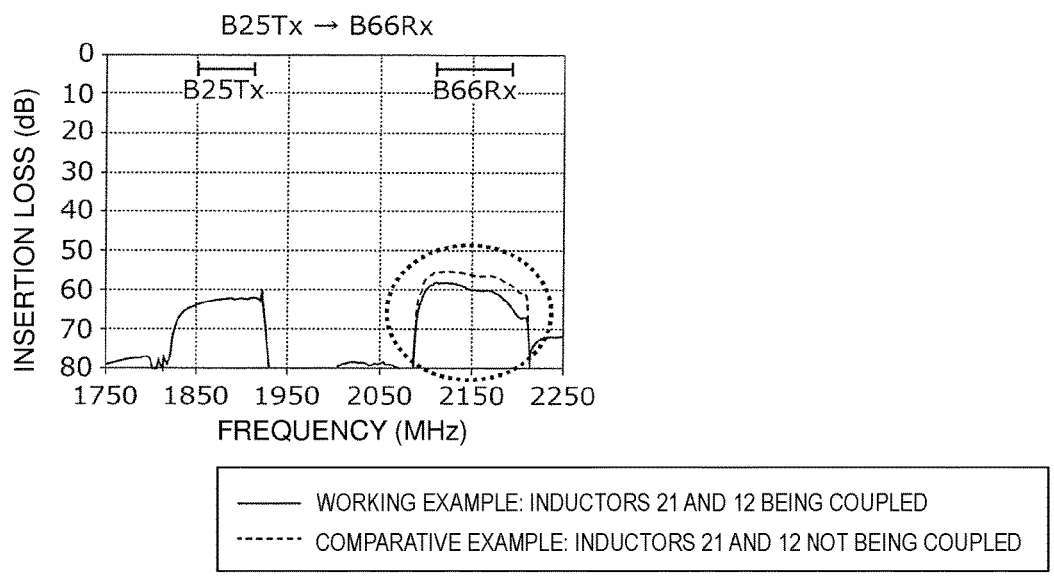
FIG. 7B is a graph illustrating a comparison of isolation characteristics of Band 25 transmission filters-Band 66 reception filters of the multiplexers according to the working example and the comparative example.

FIG. 7B is a graph illustrating a comparison of isolation characteristics of the Band 25 transmission filters–the Band 66 reception filters of the multiplexers according to the working example and the comparative example. In the multiplexers according to the working example and the comparative example, since the inductor is not provided in the reception path in which the reception filter 40 is provided, it is estimated that there is no cross-isolation improvement effect by the magnetic field coupling with the inductor 12. Note that, since the high frequency components P25 leaking to the reception filter 20 among the high-frequency transmission signals of the Band 25 are canceled out by the magnetic field coupling between the inductors 12 and 21, it is estimated that the high frequency components leaking to the reception filter 40 among the high-frequency transmission signals of the Band 25 are also relatively reduced. With this, it can be seen that the cross-isolation is improved in the reception band of the Band 66 as well.

Second Preferred Embodiment

In a second preferred embodiment of the present invention, a high-frequency front end circuit 3 and a communication device 4 including the multiplexer 1A according to the above-described working example will be described.

Figure 8:
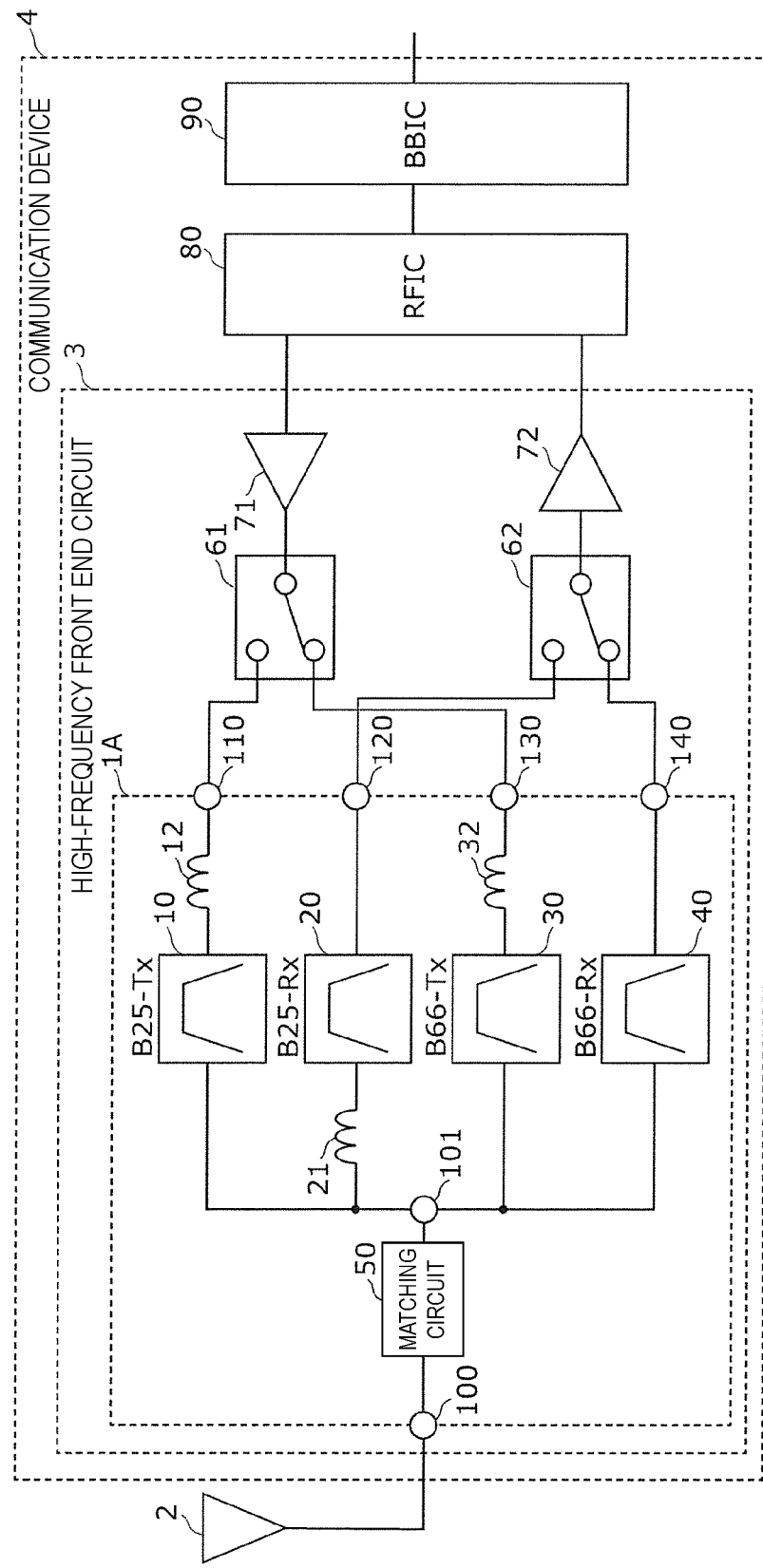
FIG. 8 is a circuit configuration diagram of a high-frequency front end circuit and a communication device according to a second preferred embodiment of the present invention.

FIG. 8 is a circuit configuration diagram of the high-frequency front end circuit 3 and the communication device 4 according to the second preferred embodiment. This diagram illustrates the high-frequency front end circuit 3, an antenna element 2, an RF signal processing circuit (RFIC) 80, and a baseband signal processing circuit (BBIC) 90. The high-frequency front end circuit 3, the RF signal processing circuit 80, and the baseband signal processing circuit 90 define the communication device 4.

The high-frequency front end circuit 3 includes the multiplexer 1A according to the working example, a transmission-side switch 61 and a reception-side switch 62, a power amplifier circuit 71, and a low noise amplifier circuit 72.

The transmission-side switch 61 is a switch circuit including two selection terminals respectively connected to the transmission terminals 110 and 130 of the multiplexer 1A and a common terminal connected to the power amplifier circuit 71.

The reception-side switch 62 is a switch circuit including two selection terminals respectively connected to the reception terminals 120 and 140 of the multiplexer 1A and a common terminal connected to the low noise amplifier circuit 72.

The transmission-side switch 61 and the reception-side switch 62 are preferably each, for example, an SPDT (Single Pole Double Throw) switch which connects the common terminal and a signal path corresponding to a predetermined band to each other in accordance with a control signal from a controller (not illustrated). Note that, the number of the selection terminals connected to the common terminal is not limited to one, and may be more than one. In other words, the high-frequency front end circuit 3 may be compliant with carrier aggregation (CA).

The power amplifier circuit 71 is a transmission amplification circuit which amplifies a high-frequency signal (here, a high-frequency transmission signal) output from the RF signal processing circuit 80 and outputs the resulting signal to the antenna element 2 through the transmission-side switch 61 and the multiplexer 1A.

The low noise amplifier circuit 72 is a reception amplification circuit which amplifies a high-frequency signal (here, a high-frequency reception signal) having passed through the antenna element 2, the multiplexer 1A, and the reception-side switch 62 and outputs the resulting signal to the RF signal processing circuit 80.

The RF signal processing circuit 80 performs signal processing on a high-frequency reception signal input from the antenna element 2 through a reception signal path by down-conversion or other suitable process, and outputs the reception signal generated by the signal processing to the baseband signal processing circuit 90. Additionally, the RF signal processing circuit 80 performs signal processing on a transmission signal input from the baseband signal processing circuit 90 by up-conversion or other suitable process, and outputs the high-frequency transmission signal generated by the signal processing to the power amplifier circuit 71. The RF signal processing circuit 80 is preferably, for example, an RFIC.

A signal processed by the baseband signal processing circuit 90 is used, for example, for image display as an image signal, or for a call as an audio signal.

Note that, the high-frequency front end circuit 3 may include other circuit elements between the elements described above.

With the high-frequency front end circuit 3 and the communication device 4 described above, by including the multiplexer 1A according to the above-described working example, even if the number of assigned frequency bands (bands) increases, isolation between the transmission path in which each transmission filter is provided and the reception path in which each reception filter is provided is able to be improved.

Additionally, the communication device 4 may not include the baseband signal processing circuit 90 in accordance with a processing method of the high-frequency signal.

Although the multiplexer, the high-frequency front end circuit, and the communication device according to preferred embodiments of the present invention have been described above using the working examples and the variation, the present invention also encompasses other preferred embodiments that are provided by combining desired elements in the above-described preferred embodiments, the working examples, and the variation, variations obtained by adding various modifications to the above-described preferred embodiments, which are conceived by those skilled in the art, without departing from the gist of the present invention, and various apparatuses incorporating the high-frequency front end circuit and communication device according to preferred embodiments of the present invention.

Although, the above description has been provided using a quadplexer of the Band 25+the Band 66 as an example of a multiplexer, the present invention is not limited thereto, and, for example, may be applied to a multiplexer in which three or more filters are included and connected by a common terminal.

The present invention may be widely used for communication apparatuses, such as cellular phones or other suitable apparatuses, as multiplexers, high-frequency front end circuits, and communication devices with high isolation and high cross-isolation capable of being applied to multiband and multimode frequency standards.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
a common terminal, a first reception terminal, a first transmission terminal, and a second transmission terminal;
a first reception filter provided between the common terminal and the first reception terminal;
a first transmission filter provided between the common terminal and the first transmission terminal;
a second transmission filter provided between the common terminal and the second transmission terminal;
a first inductor connected in series between the common terminal and the first reception filter;
a second inductor connected between the first transmission terminal and the first transmission filter; and
a third inductor connected between the second transmission terminal and the second transmission filter; wherein
the first inductor and the second inductor couple with each other through a magnetic field; and
the first inductor and the third inductor couple with each other through a magnetic field.

2. The multiplexer according to claim 1, wherein
the second inductor is connected in series between the first transmission terminal and the first transmission filter;
the third inductor is connected in series between the second transmission terminal and the second transmission filter; and
an inductance value of the first inductor is larger than an inductance value of the second inductor and larger than an inductance value of the third inductor.

3. The multiplexer according to claim 1, wherein
the first reception filter has, of a first transmission band and a first reception band assigned to a first frequency band, the first reception band as a pass band;
the first transmission filter has the first transmission band as a pass band; and
the second transmission filter has, of a second transmission band and a second reception band assigned to a second frequency band different from the first frequency band, the second transmission band as a pass band.

4. The multiplexer according to claim 1, wherein each of the first reception filter, the first transmission filter, and the second transmission filter is any one of a surface acoustic wave filter, an elastic wave filter using a bulk acoustic wave, an LC resonance filter, and a dielectric filter.

5. The multiplexer according to claim 1, further comprising:
an antenna terminal connected to an antenna element; and
an impedance matching circuit connected between the antenna terminal and the common terminal.

6. A high-frequency front end circuit comprising:
the multiplexer according to claim 1; and
an amplification circuit connected to the multiplexer.

7. The high-frequency front end circuit according to claim 6, wherein
the second inductor is connected in series between the first transmission terminal and the first transmission filter;
the third inductor is connected in series between the second transmission terminal and the second transmission filter; and
an inductance value of the first inductor is larger than an inductance value of the second inductor and larger than an inductance value of the third inductor.

8. The high-frequency front end circuit according to claim 6, wherein
the first reception filter has, of a first transmission band and a first reception band assigned to a first frequency band, the first reception band as a pass band;
the first transmission filter has the first transmission band as a pass band; and
the second transmission filter has, of a second transmission band and a second reception band assigned to a second frequency band different from the first frequency band, the second transmission band as a pass band.

9. The high-frequency front end circuit according to claim 6, wherein each of the first reception filter, the first transmission filter, and the second transmission filter is any one of a surface acoustic wave filter, an elastic wave filter using a bulk acoustic wave, an LC resonance filter, and a dielectric filter.

10. The high-frequency front end circuit according to claim 6, further comprising:
an antenna terminal connected to an antenna element; and
an impedance matching circuit connected between the antenna terminal and the common terminal.

11. A communication device comprising:
an RF signal processing circuit to process a high-frequency signal transmitted and received through an antenna element; and
the high-frequency front end circuit according to claim 6 to transmit the high-frequency signal between the antenna element and the RF signal processing circuit.

12. A multiplexer comprising:
a common terminal, a first transmission terminal, a first reception terminal, and a second reception terminal;
a first transmission filter provided between the common terminal and the first transmission terminal;
a first reception filter provided between the common terminal and the first reception terminal;
a second reception filter provided between the common terminal and the second reception terminal;
a first inductor connected in series between the common terminal and the first transmission filter;
a second inductor connected between the first reception terminal and the first reception filter; and
a third inductor connected between the second reception terminal and the second reception filter; wherein
the first inductor and the second inductor couple with each other through a magnetic field; and
the first inductor and the third inductor couple with each other through a magnetic field.

13. The multiplexer according to claim 12, wherein
the second inductor is connected in series between the first reception terminal and the first reception filter;
the third inductor is connected in series between the second reception terminal and the second reception filter; and
an inductance value of the first inductor is smaller than an inductance value of the second inductor and smaller than an inductance value of the third inductor.

14. The multiplexer according to claim 12, wherein the first transmission filter has, of a first transmission band and a first reception band assigned to a first frequency band, the first transmission band as a pass band;
the first reception filter has the first reception band as a pass band; and
the second reception filter has, of a second transmission band and a second reception band assigned to a second frequency band different from the first frequency band, the second reception band as a pass band.

15. The multiplexer according to claim 12, wherein each of the first transmission filter, the first reception filter, and the second reception filter is any one of a surface acoustic wave filter, an elastic wave filter using a bulk acoustic wave, an LC resonance filter, and a dielectric filter.

16. A high-frequency front end circuit comprising:
the multiplexer according to claim 12; and
an amplification circuit connected to the multiplexer.

17. The high-frequency front end circuit according to claim 16, wherein
the second inductor is connected in series between the first reception terminal and the first reception filter;
the third inductor is connected in series between the second reception terminal and the second reception filter; and
an inductance value of the first inductor is smaller than an inductance value of the second inductor and smaller than an inductance value of the third inductor.

18. The high-frequency front end circuit according to claim 16, wherein
the first transmission filter has, of a first transmission band and a first reception band assigned to a first frequency band, the first transmission band as a pass band;
the first reception filter has the first reception band as a pass band; and
the second reception filter has, of a second transmission band and a second reception band assigned to a second frequency band different from the first frequency band, the second reception band as a pass band.

19. The high-frequency front end circuit according to claim 16, wherein each of the first transmission filter, the first reception filter, and the second reception filter is any one of a surface acoustic wave filter, an elastic wave filter using a bulk acoustic wave, an LC resonance filter, and a dielectric filter.

20. A communication device comprising:
an RF signal processing circuit to process a high-frequency signal transmitted and received through an antenna element; and
the high-frequency front end circuit according to claim 15 to transmit the high-frequency signal between the antenna element and the RF signal processing circuit.

* * * * *